（12） United States Patent
Oh et al.

(10) Patent No.: US 7,010,287 B2
(45) Date of Patent: Mar. 7, 2006

(54) QUADRATURE SIGNAL GENERATOR WITH FEEDBACK TYPE FREQUENCY DOUBLER

(75) Inventors: Seung Min Oh, Chunlabook-do (KR); Hyo Seok Kwon, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 406 days.

(21) Appl. No.: 10/464,780

(22) Filed: Jun. 19, 2003

(65) Prior Publication Data

US 2004/0198297 A1   Oct. 7, 2004

(30) Foreign Application Priority Data

Apr. 1, 2003   (KR)   ...................... 10-2003-0020349

(51) Int. Cl.
*H04B 1/26* (2006.01)
(52) U.S. Cl. ...................... 455/318; 455/323; 327/113; 331/18
(58) Field of Classification Search ................ 455/131, 455/302, 313, 318, 323, 324, 334; 327/100, 327/113, 116, 117; 331/1 R, 18, 74, 175; 375/322, 324, 334, 344
See application file for complete search history.

(56) References Cited

U.S. PATENT DOCUMENTS

| | | | |
|---|---|---|---|
| 4,596,954 A | * | 6/1986 | Haque .......................... 327/116 |
| 4,641,101 A | | 2/1987 | Selim |
| 5,635,866 A | * | 6/1997 | Monk et al. ................. 327/116 |
| 5,983,082 A | | 11/1999 | Hilbert |
| 6,198,332 B1 | * | 3/2001 | O'Tool et al. ............... 327/356 |
| 6,538,520 B1 | * | 3/2003 | Merrill et al. ................ 331/18 |
| 6,720,806 B1 | * | 4/2004 | Merrill et al. .............. 327/116 |

* cited by examiner

*Primary Examiner*—Quochien B. Vuong
(74) *Attorney, Agent, or Firm*—Lowe Hauptman & Berner, LLP (57) ABSTRACT

Disclosed is a quadrature signal generator for generating an in-phase signal and a quadrature-phase signal, which is capable of generating a quadrature signal having the same frequency as a differential oscillating frequency, using a feedback control system. The quadrature signal generator includes an oscillator for generating a differential oscillation frequency signal having predetermined differential oscillation frequencies; a feedback type frequency doubler for generating a differential frequency signal having differential frequency components corresponding to differential frequency components of a frequency sum signal obtained by summing the differential oscillation frequency signal received from the oscillator and a differential feedback signal received at the differential feedback terminal; and a frequency divider for dividing the differential frequency signal received at the differential input terminal thereof by 2, thereby generating a quadrature signal consisting of two differential output frequency signals to supply at least one differential output frequency signal of the quadrature signal to the feedback type frequency doubler as the differential feedback signal.

10 Claims, 9 Drawing Sheets

PRIOR ART

QUADRATURE SIGNAL GENERATOR WITH FEEDBACK TYPE FREQUENCY DOUBLER

BACKGROUND OF THE INVENTION

1. Field of the Invention

The present invention relates to a quadrature signal generator applied to a ZERO-IF converter or image rejection converter of a broadcast receiver, and more particularly to a quadrature signal generator for generating an in-phase (hereinafter, referred to as an "I signal") and a quadrature-phase signal (hereinafter, referred to as a "Q signal") while having a feedback type frequency doubler capable of making the Q signal have the same frequency as a differential oscillating frequency, using a feedback control system, thereby securing more reliable symmetric characteristics.

2. Description of the Related Art

Generally, the ZERO-IF converter and image rejection converter of a satellite broadcast receiver use a quadrature modulator for generating modulated I and Q signals. Such a quadrature modulator is illustrated in FIG. 1.

Figure 1:
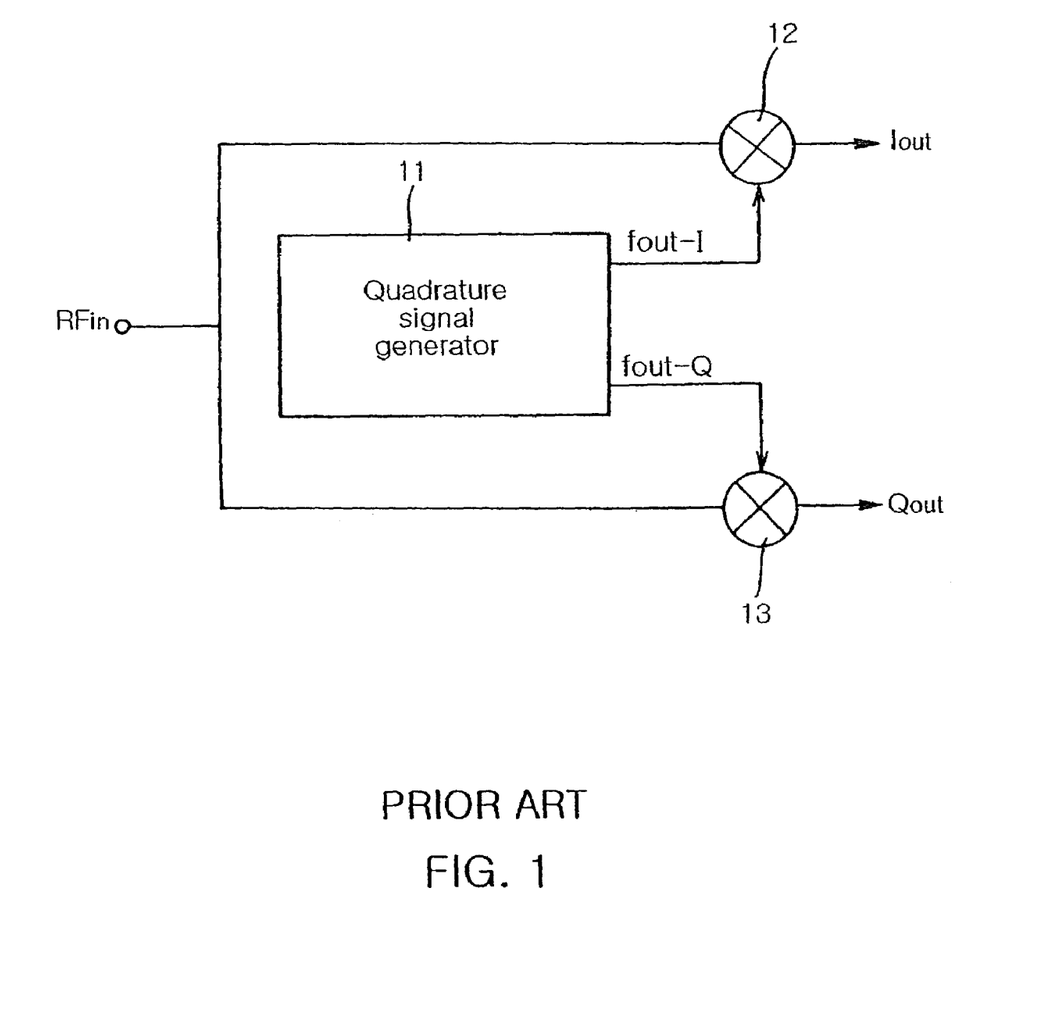
FIG. 1 is a schematic diagram illustrating a general quadrature modulator.

FIG. 1 is a schematic diagram illustrating a general quadrature modulator. Referring to FIG. 1, the quadrature modulator generally includes a quadrature signal generator 11 for generating a quadrature signal having I signal components and Q signal components, a first mixer 12 for mixing the I signal fout-I from the quadrature signal generator 11 with an input signal (RF signal), and a second mixer 13 for mixing the Q signal fout-Q from the quadrature signal generator 11 with the input signal (RF signal).

Such a quadrature signal generator should be designed, taking into consideration various characteristics such as frequency, phase, and amplitude characteristics, noise characteristics, bandwidth characteristics, power characteristics, and symmetric characteristics between I and Q signals. In this regard, a poly-phase filter, a frequency divider, or a ring type VCO (Voice Carry Over) is used for traditional quadrature signal generators. The characteristics of such devices will be described in brief hereinafter.

First, a description will be made of the poly-phase filter. This poly-phase filter is most frequently used as a quadrature signal generating device in designing an MMIC (Monolithic Microwave Integrated Circuit). The poly-phase filter has a structure improved in symmetry and repeatability over a traditional RC-CR filter structure mainly used to generate a Q signal. Since the traditional RC-Cr filter structure is sensitive to resistance and capacitance, it may exhibit considerable amplitude and phase errors when the resistance and capacitance lose a desired symmetry therebetween due to variations thereof.

Furthermore, the traditional RC-CR filter structure exhibits satisfactory amplitude and phase characteristics only in a narrow band. On the other hand, where poly-phase filters of multiple stages are connected in series, it is possible to obtain satisfactory phase and amplitude error characteristics in wide bands. In this case, however, there is a problem in that a signal loss of about 3 dB occurs for every additional stage even though such a stage addition achieves an expansion in applicable band. For this reason, in the case of a poly-phase filter designed to have multiple stages, there may be a degradation in noise characteristics and an increase in the signal loss of an associated oscillator. In order to compensate for such affects, the buffer circuit of the oscillator must have high voltage gain characteristics, thereby resulting in an increased consumption of current.

Now, the frequency divider will be described. Recently, demand for a multi-band (for example, a multi-band of 900 MHz and 1.8 GHz) has been increased. To meet such a demand, a direct frequency conversion has been required. Also, it has been required to eliminate use of external elements. In order to meet such requirements, an image rejection converter and a direct frequency conversion type receiver may be used. In this case, it is necessary to use a quadrature signal generator as a frequency divider. This quadrature signal generator is preferable because it operates at a frequency higher than that of frequency dividers of other types. The quadrature signal generator is operable at a high frequency in both the case of using a CMOS process and the case of using a bipolar process. In this case, however, it is important to determine an appropriate transistor size, taking into consideration operable frequency and power consumption because the operable frequency and power consumption are inversely related.

The most significant problem of such a frequency divider is that the input frequency is double the output frequency. In order to use such a frequency divider, it is necessary to generate a frequency higher than a usage frequency by two times. In this case, however, the associate frequency generator involves an increase in phase noise, and an increase in power consumption. Even when a frequency doubler is used, problems of an increase in phase noise and an increase in power consumption still occur.

The ring type VCO will now be described. This ring type VCO has a relatively small size because it has a wide oscillation frequency adjustment range while including no inductor. However, the ring type VOC is hardly used in an RF range because it exhibits considerably degraded phase noise characteristics, as compared to LC type VCOs. Besides, such a ring type VCO is mainly used as a frequency generator of 1 GHz or less because it can achieve an easy oscillation even in a high frequency range, and its wide frequency adjustment range provides an important advantage.

In order to solve the drawbacks involved with the above mentioned traditional quadrature signal generators, various quadrature signal generators have recently been researched and developed. An example of such conventional quadrature signal generators will be described hereinafter.

Figure 2:
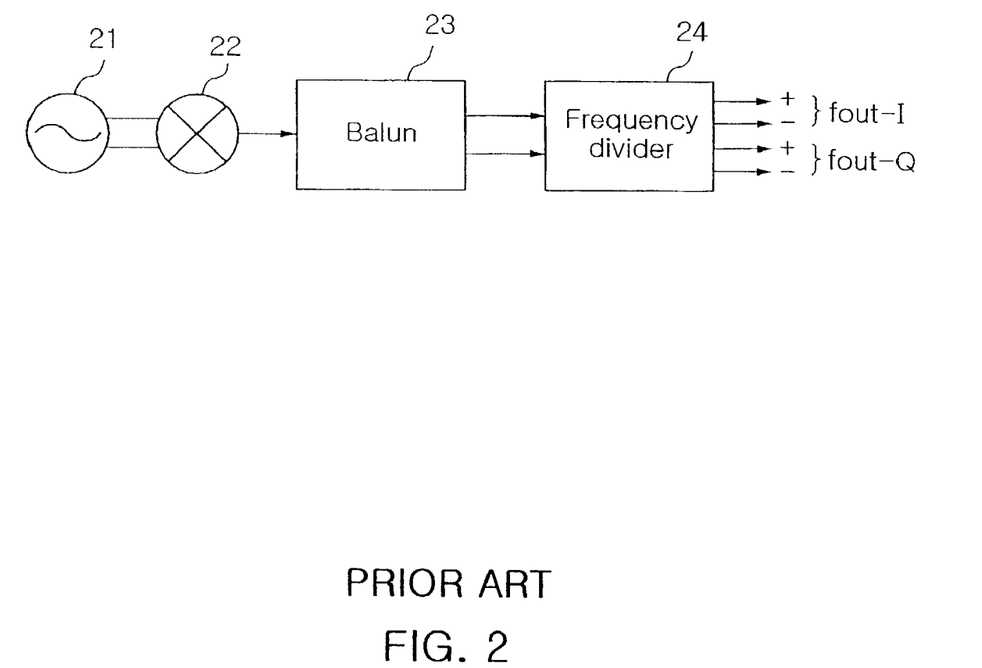
FIG. 2 is a schematic diagram illustrating the configuration of a conventional quadrature signal generator.

FIG. 2 is a schematic diagram illustrating the configuration of a conventional quadrature signal generator. The conventional quadrature signal generator shown in FIG. 2 includes an oscillator 21 for generating a differential oscillation frequency signal having differential oscillation frequency components, a frequency doubler 22 for doubling the frequency components of the differential oscillation frequency signal received from the oscillator 21, thereby outputting a signal having single-frequency components, a balun 23 for receiving the single-frequency signal from the frequency doubler 22, thereby outputting a signal having differential frequency components, and a frequency divider 24 for dividing the differential frequency signal received from the balun 23 by 2, thereby outputting a quadrature signal having quadrature frequency components.

In the conventional quadrature signal generator of FIG. 2, the output frequency of the frequency doubler is single. For this reason, it is necessary to use an additional balun in order to obtain differential frequencies from the single frequency.

Although the above mentioned conventional quadrature signal generator has an advantage in that it is possible to generate quadrature frequencies identical to the output frequency of the oscillator, there is a problem in that the complexity of the quadrature signal generator increases because an additional balun should be used. Furthermore, although the conventional quadrature signal generator can perform its function at a particular frequency, it is difficult to generate perfect differential frequencies in a frequency range beyond the particular frequency because a frequency delay occurs due to the characteristics of the balun. Where it is impossible to generate such perfect differential frequencies, there is a problem in that mismatch of I and Q signals occurs.

SUMMARY OF THE INVENTION

The present invention has been made in view of the above mentioned problems, and an object of the invention is to provide a quadrature signal generator for generating I and Q signals while having a feedback type frequency doubler capable of making the Q signal have the same frequency as a differential oscillating frequency, using a feedback control system.

Another object of the invention is to provide a quadrature signal generator with a feedback type frequency doubler which is capable of securing more reliable symmetric characteristics.

In accordance with the present invention, these objects are accomplished by providing a quadrature signal generator comprising:

an oscillator for generating a differential oscillation frequency signal having predetermined differential oscillation frequencies;

a feedback type frequency doubler having a differential input terminal connected to an output terminal of the oscillator while having a differential feedback terminal and a differential output terminal, the feedback type frequency doubler generating a differential frequency signal having differential frequency components corresponding to differential frequency components of a frequency sum signal obtained by summing the differential oscillation frequency signal received from the oscillator and a differential feedback signal received at the differential feedback terminal, and outputting the differential frequency signal at the differential output terminal; and a frequency divider having a differential input terminal connected to the differential output terminal of the feedback type frequency doubler, and a quadrature output terminal including two differential output terminals, the frequency divider dividing the differential frequency signal received at the differential input terminal thereof by 2, thereby generating a quadrature signal consisting of two differential output frequency signals each having differential frequency components, and outputting the quadrature signal through the quadrature output terminal thereof to supply at least one differential output frequency signal of the quadrature signal to the feedback type frequency doubler as the differential feedback signal.

The differential feedback terminal of the feedback type frequency doubler may be connected to one differential output terminal of the quadrature output terminal in the frequency divider. In this case, the feedback type frequency doubler comprises a mixer for mixing the differential output frequency signal fed back from the frequency divider with the differential oscillation frequency signal received from the oscillator, thereby generating frequency sum and difference signals, and a filter for receiving the frequency sum and difference signals, and selectively allowing the frequency sum signal to pass therethrough.

Alternatively, the differential feedback terminal of the feedback type frequency doubler may include a first differential feedback terminal connected to one differential output terminal of the quadrature output terminal in the frequency divider, and a second differential feedback terminal connected to the other differential output terminal of the quadrature output terminal in the frequency divider. In this case, the feedback type frequency doubler comprises a mixer for synthesizing the differential output frequency signals fed back from the frequency divider to generate a synthesized signal, and mixing the synthesized signal with the differential oscillation frequency signal received from the oscillator, thereby generating frequency sum and difference signals, and a filter for receiving the frequency sum and difference signals, and selectively allowing the frequency sum signal to pass therethrough.

The quadrature signal outputted from the frequency divider is set to have the same frequency as the differential oscillation frequency signal from the oscillator. The frequency sum signal outputted from the mixer is set to have a frequency double the frequency of the differential oscillation frequency signal from the oscillator.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Now, preferred embodiments of the present invention will be described in detail.

Figure 3:
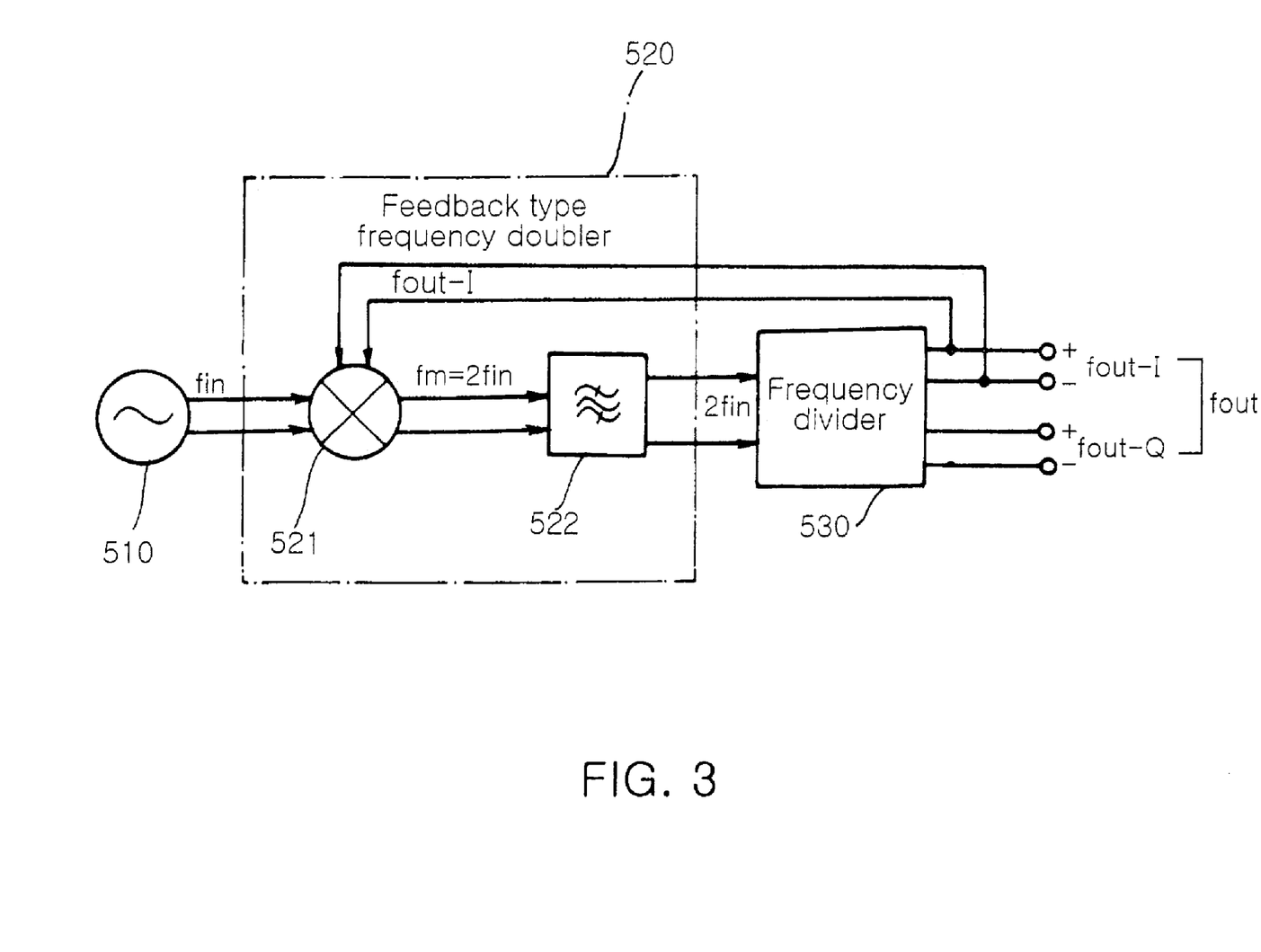
FIG. 3 is a block diagram illustrating a quadrature signal generator with a feedback type frequency doubler according to a first embodiment of the present invention.

FIG. 3 is a block diagram illustrating a quadrature signal generator with a feedback type frequency doubler according to a first embodiment of the present invention.

Referring to FIG. 3, the quadrature signal generator according to the first embodiment of the present invention includes an oscillator 510, a feedback type frequency doubler 520, and a frequency divider 530.

In accordance with the first embodiment of the present invention, the oscillator 510 is adapted to generate a differential oscillation frequency signal fin having predetermined differential oscillation frequencies. The feedback type frequency doubler 520 has a differential input terminal connected to an output terminal of the oscillator 510 while having a differential feedback terminal and a differential output terminal. The feedback type frequency doubler 520 generates a differential frequency signal fm having differential frequency components obtained by summing the differential oscillation frequency signal fin received from the oscillator 510 and a quadrature signal fout received at the differential feedback terminal, that is, a frequency sum signal fin+fout, and outputs the differential frequency signal fm at the differential output terminal.

The frequency divider 530 has a differential input terminal connected to the differential output terminal of the feedback type frequency doubler 520, and a quadrature output terminal consisting of two differential output terminals. The frequency divider 530 divides the differential frequency signal fm received at its differential input terminal by 2, thereby generating a quadrature signal fout consisting of two differential output frequency signals fout-I and fout-Q each having differential frequency components. The frequency divider 530 outputs the quadrature signal fout through its quadrature output terminal.

The differential feedback terminal of the feedback type frequency doubler 520 is connected to one differential output terminal of the quadrature output terminal of the frequency divider 530, that its, the output terminal for one differential output frequency signal fout-I or the output terminal for the other differential output frequency signal fout-Q. This feedback type frequency doubler 520 includes a mixer 521 for mixing the quadrature signal fout fed back from the frequency divider 530 with the differential oscillation frequency signal fin received from the oscillator 510, thereby generating frequency sum and difference signals fin±fout, and a filter 522 for receiving the frequency sum and difference signals fin±fout, and selectively allowing the frequency sum signal fin+fout to pass therethrough (fm=fin+fout).

Figure 4:
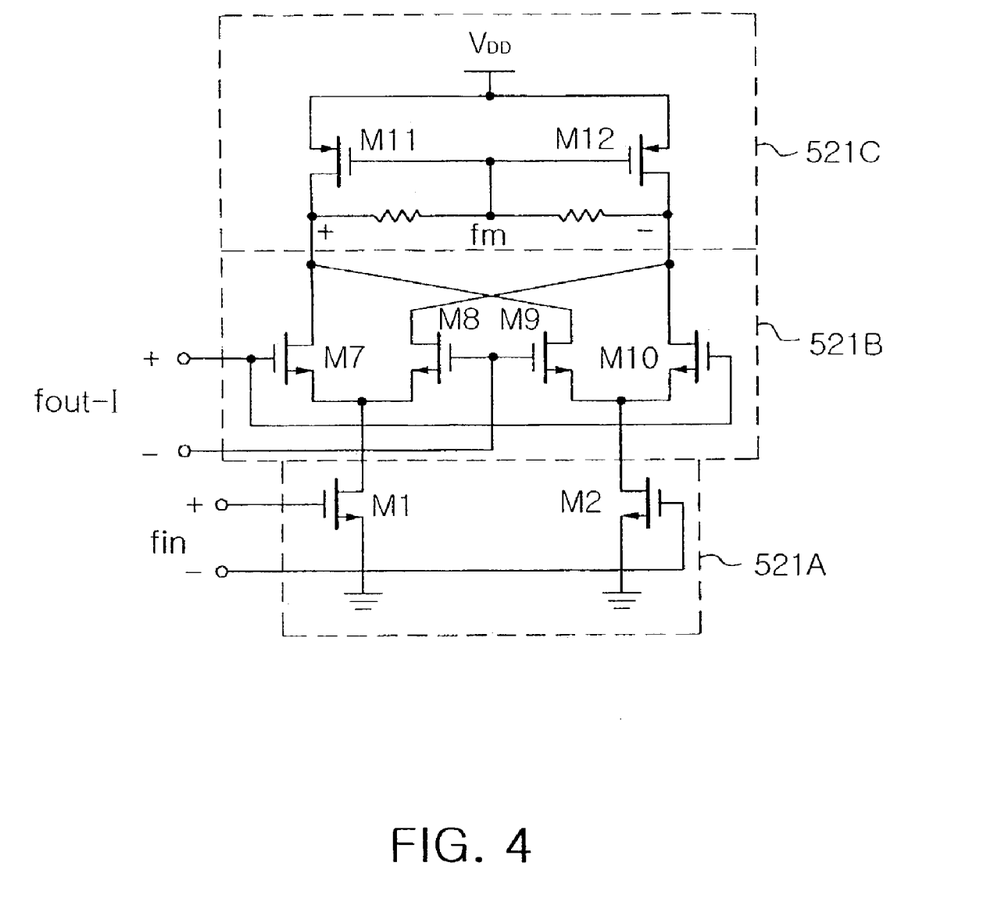
FIG. 4 is a circuit diagram of a mixer shown in FIG. 3.

FIG. 4 is a circuit diagram of the mixer 521 shown in FIG. 3. Referring to FIG. 4, the mixer 521 applied to the first embodiment of the present invention is implemented to have a structure adapted to feed back a selected one of two differential frequency signals. For this mixer 521 having such a structure, a conventional mixer may be used. An example of such a mixer is illustrated in FIG. 4.

The mixer 521 shown in FIG. 4 may include an RF amplifying unit 521A for amplifying the differential oscillation frequency signal fin from the oscillator 510, a switching unit 521B for switching on/off the differential oscillation frequency signal fin received through the RF amplifying unit 521A in accordance with the quadrature signal fout fed back from the frequency divider 530, that is, the differential output frequency signal fout-I or fout-Q of the quadrature signal fout, thereby generating frequency sum and difference signals fin±fout, and a load unit 521C for I/V converting the signal generated from the switching unit 521B.

Although the fed-back signal has been described as being the differential output frequency signal fout-I in FIGS. 3 and 4, this is only exemplary. In accordance with the present invention, the fed-back signal may also be the differential output frequency signal fout-Q. Alternatively, the differential output frequency signal fout-I or fout-Q of the quadrature signal may be inputted to the RF amplifying unit 521A. In this case, the differential oscillation frequency fin is inputted to the switching unit 521B.

The quadrature signal fout outputted from the frequency divider 530 is set to have frequencies identical to respective frequencies of the differential oscillation frequency signal fin of the oscillator 510. Each frequency of the frequency sum signal fm (fm=fin+fout) outputted from the mixer 521 is set to be double an associated frequency of the differential oscillation frequency signal fin outputted from the oscillator 510 (fm=2fin).

Figure 5:
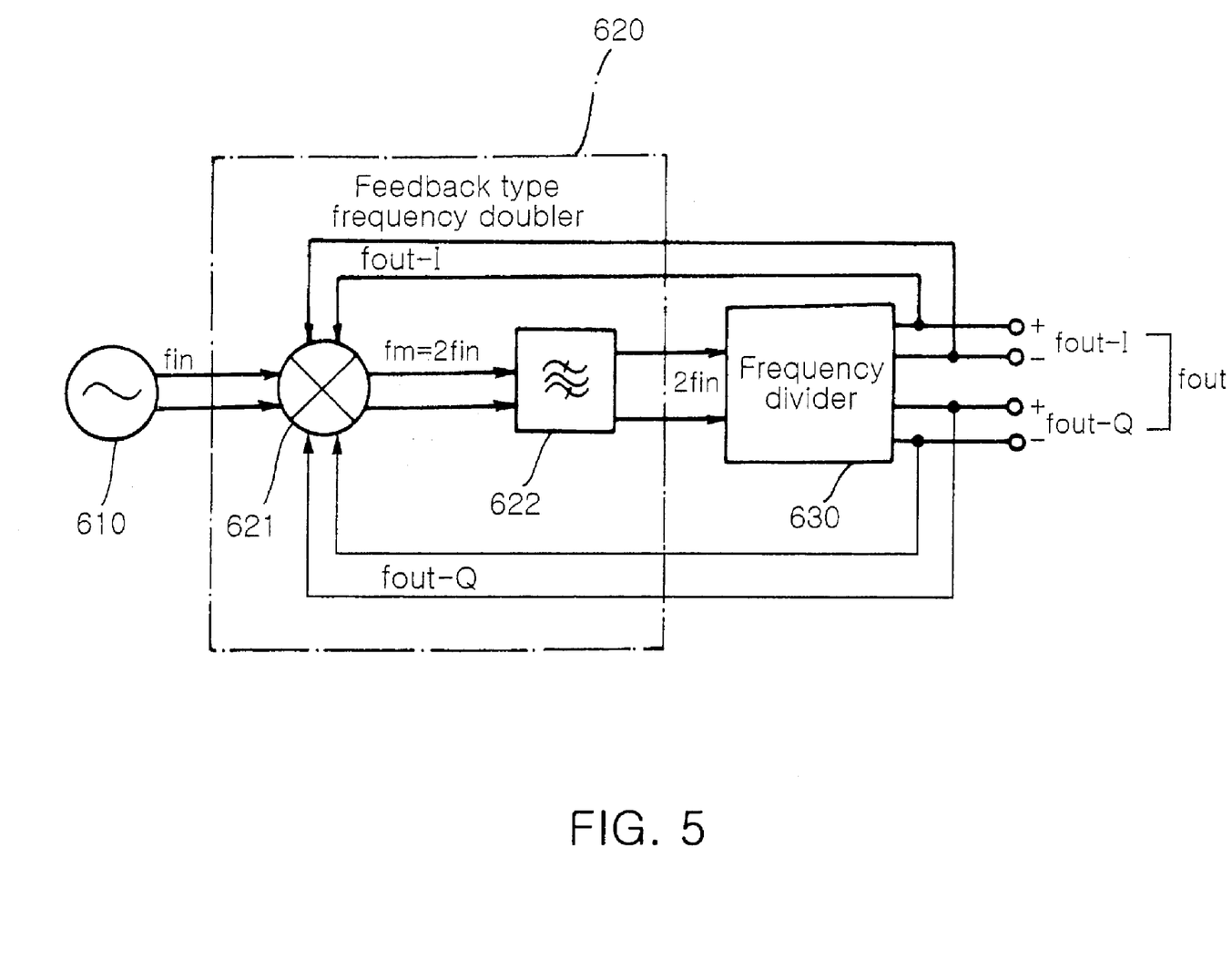
FIG. 5 is a block diagram illustrating a quadrature signal generator with a feedback type frequency doubler according to a second embodiment of the present invention.

FIG. 5 is a block diagram illustrating a quadrature signal generator with a feedback type frequency doubler according to a second embodiment of the present invention.

Referring to FIG. 5, the quadrature signal generator according to the first embodiment of the present invention includes an oscillator 610, a feedback type frequency doubler 620, and a frequency divider 630.

The oscillator 610, feedback type frequency doubler 620, and frequency divider 630 according to the second embodiment of the present invention are similar to the oscillator 510, feedback type frequency doubler 520, and frequency divider 530 according to the first embodiment of the present invention, respectively.

The quadrature signal generator according to the first embodiment of the present invention secures reliable symmetric characteristics by feeding back one differential output frequency signal fout-I or fout-Q of the quadrature signal fout. However, the quadrature signal generator according to the second embodiment of the present invention is configured to feed back both the differential output frequency signals fout-I and fout-Q of the quadrature signal fout in order to more reliably secure the symmetry of the I and Q signals, as compared to the first embodiment of the present invention.

The feedback type frequency doubler 620 has a differential feedback terminal consisting of a first differential feedback terminal connected to one differential output terminal of the frequency divider 630, and a second differential feedback terminal connected to the other differential output terminal of the frequency divider 630.

The feedback type frequency doubler 620 includes a mixer 621 for synthesizing the two differential output frequency signals fout-I and fout-Q fed back thereto, thereby generating a synthesized signal fout', and mixing the synthesized signal fout' with the differential oscillation frequency signal fin received from the oscillator 610, thereby outputting frequency sum and difference signals fin±fout, and a filter 622 for receiving the frequency signals fin±fout from the mixer 621, and selectively allowing the frequency sum signal fin+fout to pass therethrough.

Figure 6:
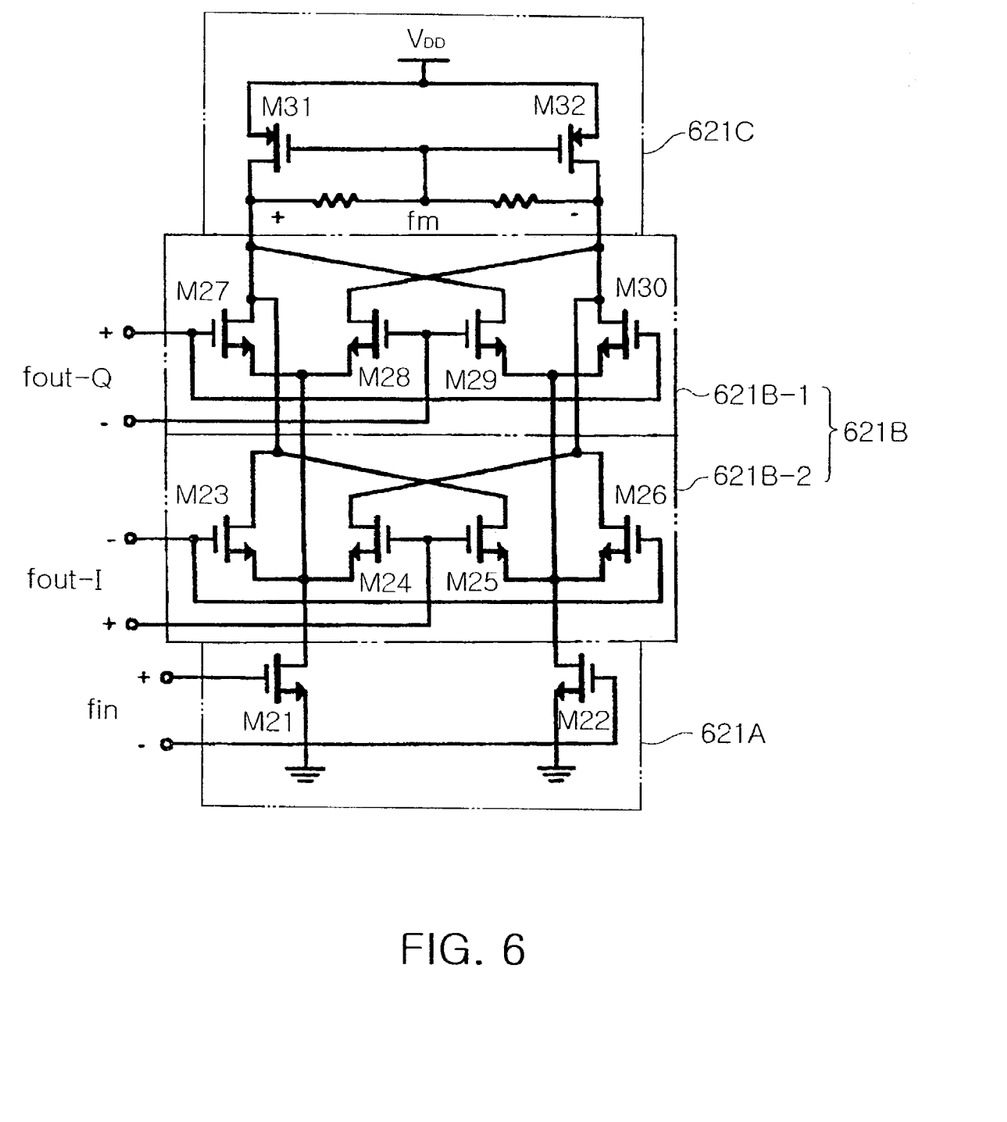
FIG. 6 is a circuit diagram of a mixer shown in FIG. 5.

FIG. 6 is a circuit diagram of the mixer shown in FIG. 5. Referring to FIG. 6, the mixer applied to the second embodiment of the present invention is implemented to have a structure adapted to feed back both the differential frequency signals fout-I and fout-Q. A preferred example of such a mixer is illustrated in FIG. 6.

The mixer shown in FIG. 6 may include an RF amplifying unit 621A for amplifying the differential oscillation frequency signal fin from the oscillator 610, a switching unit 621B for switching on/off the differential oscillation frequency signal fin received through the RF amplifying unit 621A in accordance with the synthesized signal fout' having a synthesized phase of the two differential output frequency signals fout-I and fout-Q fed back from the frequency divider 630, thereby generating frequency sum and difference signals fin±fout', and a load unit 621C for I/V converting the signal generated from the switching unit 621B.

The switching unit 621B of the mixer includes a first switching unit 621B-1 for switching on/off the differential oscillation frequency signal fin from the oscillator 610 in accordance with one of the differential output frequency signals fed back from the frequency divider 630, fout-I or fout-Q, and a second switching unit 621B-2 for switching on/off the differential oscillation frequency signal fin from the oscillator 610 in accordance with the other one of the differential output frequency signals fed back from the frequency divider 630, fout-Q or fout-I.

The quadrature signal fout outputted from the frequency divider 630 is set to have frequencies identical to respective frequencies of the differential oscillation frequency signal fin of the oscillator 610. Each frequency of the frequency sum signal fm (fm=fin+fout) outputted from the mixer 621 is set to be double an associated frequency of the differential oscillation frequency signal fin outputted from the oscillator 610 (fm=2fin).

The circuit shown in FIG. 6 is only an example which can be implemented in accordance with the present invention. Other examples may be implemented in accordance with the present invention. For example, the differential oscillation frequency fin may be inputted to the switching unit 621B, whereas the quadrature signal fount may be inputted to the RF amplifying unit 621A. In this case, the RF amplifying unit 621A may include two amplifiers having the same configuration while being connected in parallel, in order to receive respective differential output frequency signals of the quadrature signal fout through the amplifiers.

Figure 7:
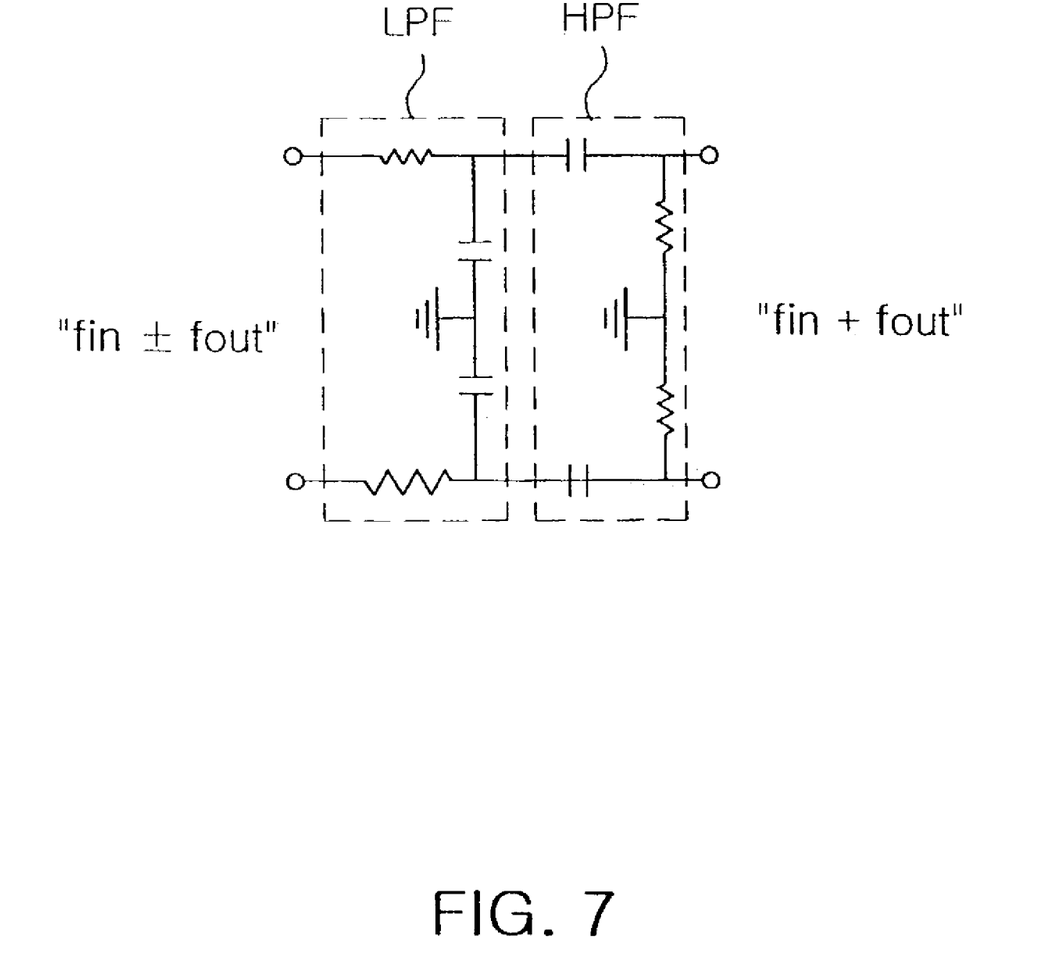
FIG. 7 is a circuit diagram of a filter according to the present invention.

FIG. 7 illustrates a circuit diagram of the filter 622 according to the present invention. Referring to FIG. 7, the filter 622 includes a low pass filter LPF set to have a cut-off frequency higher than the frequency of the frequency sum signal fm (fm=fin+fout) outputted from the mixer 621, and a high pass filter HPF set to have a cut-off frequency lower than the frequency of the frequency sum signal fm (fm=fin+fout) outputted from the mixer 621.

Figure 8A:
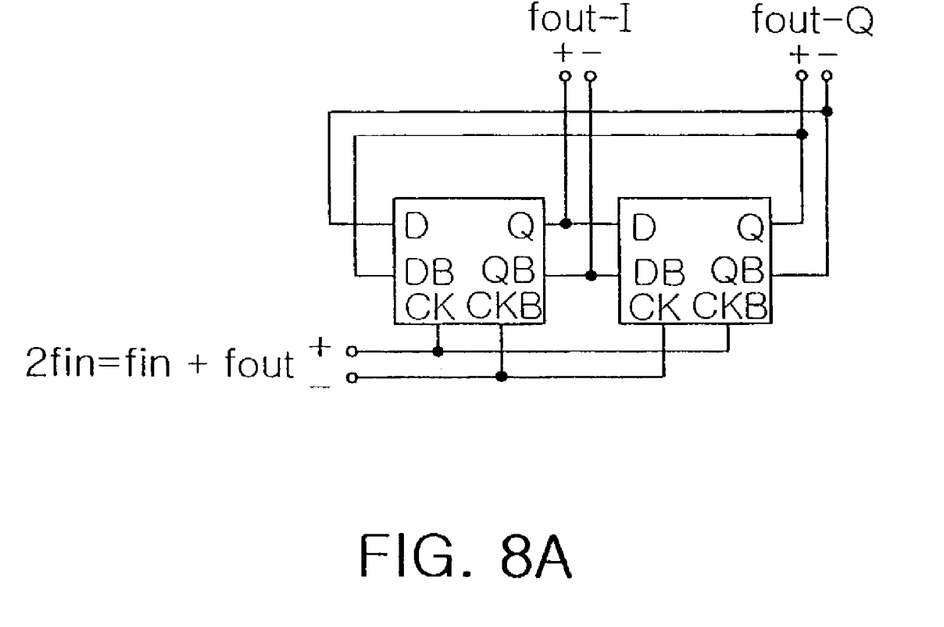
FIG. 8a is a circuit diagram of a frequency divider according to the present invention.
Figure 8B:
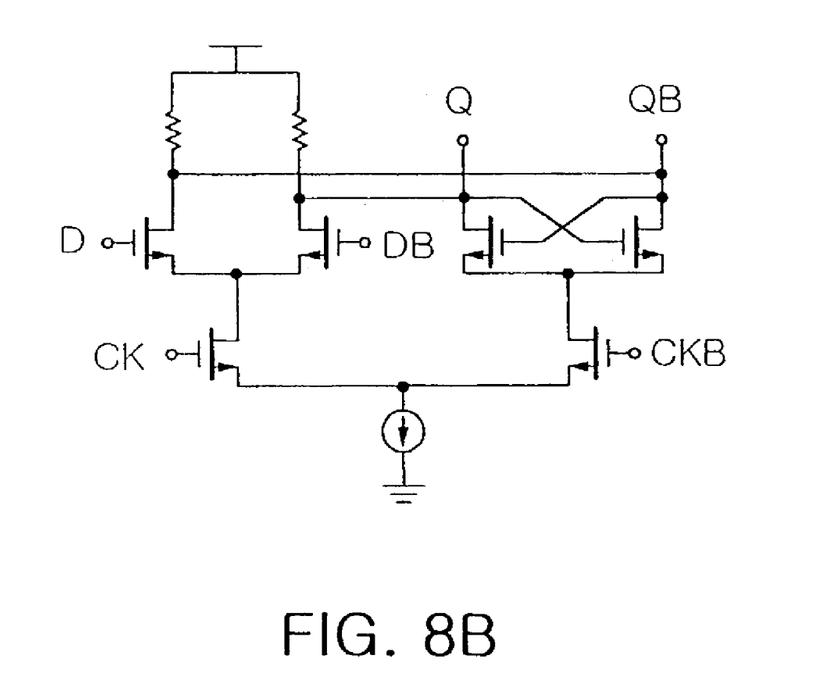
FIG. 8b is a circuit diagram illustrating the internal circuit of each latch included in the frequency divider circuit shown in FIG. 8b.
Figure 8C:
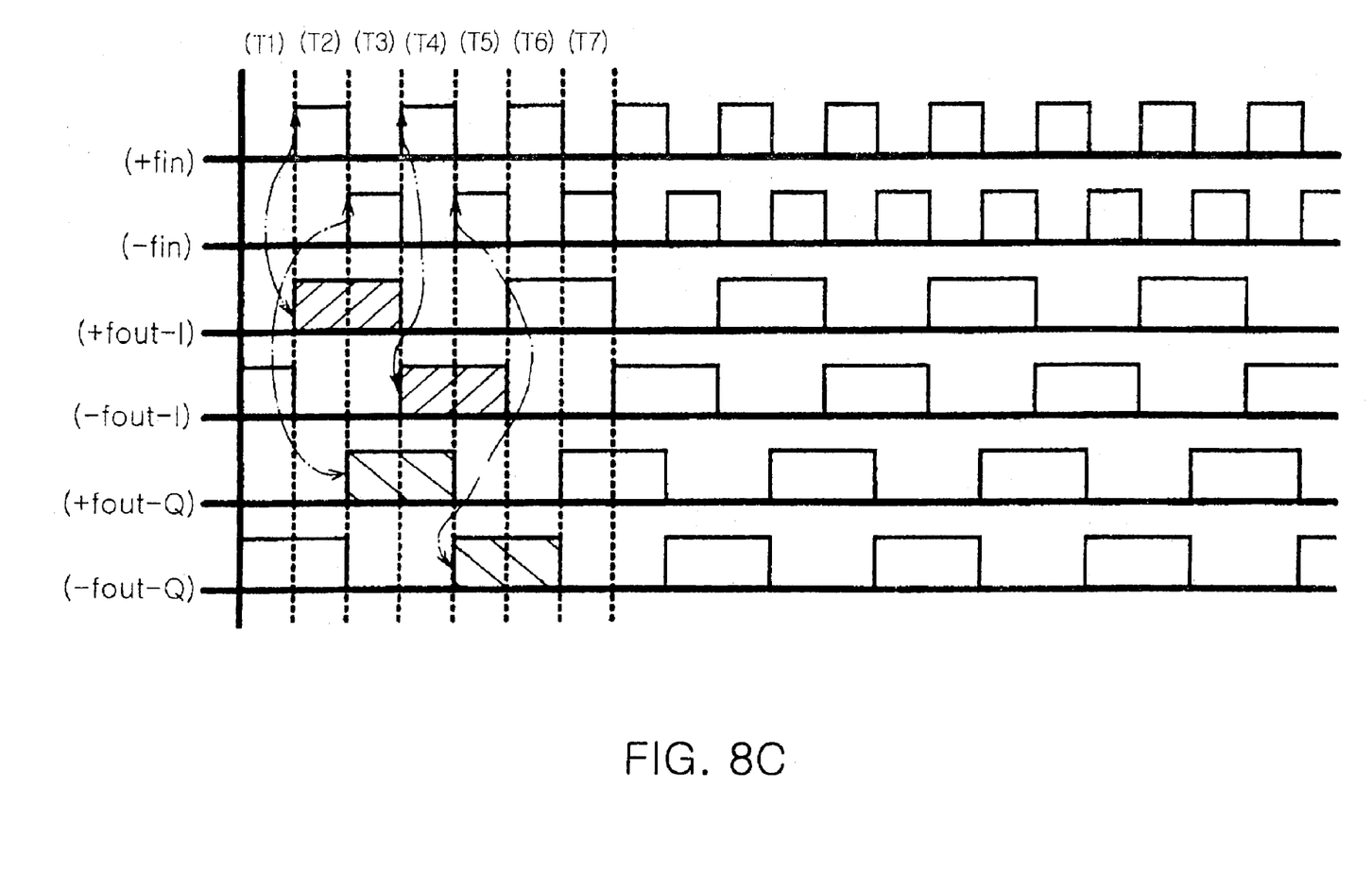
FIG. 8c is a timing diagram of a differential input signal and a quadrature signal of the frequency divider shown in FIGS. 8a and 8b.

FIG. 8a is a circuit diagram of the frequency divider according to the present invention. FIG. 8b is a circuit diagram illustrating the internal circuit of each latch included in the frequency divider circuit shown in FIG. 8b. FIG. 8c is a timing diagram of the differential input signal and quadrature signal of the frequency divider shown in FIGS. 8a and 8b.

Referring to FIG. 8a, the frequency divider of the present invention includes first and second latch units LA1 and LA2 for generating differential outputs alternately activated in accordance with the differential output signal from the feedback type frequency doubler, respectively. Each of the first and second latch units LA1 and LA2 may be implemented using a D-type flip-flop.

The first latch unit LA1 has clock terminals CK and CKB corresponding to differential input terminals connected to respective differential outputs of the feedback type frequency doubler, D-terminals D and DB connected to respective differential outputs of the second latch LA2, and output terminals Q and QB for providing differential outputs in accordance with signals respectively inputted to the clock terminals CK and CKB, respectively. On the other hand, the second latch unit LA2 has clock terminals CK and CKB corresponding to differential input terminals connected to respective differential outputs of the feedback type frequency doubler, D-terminals D and DB connected to respective differential outputs of the first latch LA1, and output terminals Q and QB for providing differential outputs in accordance with signals respectively inputted to the clock terminals CK and CKB of the second latch unit LA2, respectively.

Referring to FIG. 8b, each of the first and second latch units LA1 and LA2 includes an inverter INT, a latch LA, and a current source ISI. The inverter INT includes a first transistor TR1 having a gate connected to one of the D-terminals of the associated latch unit, D or DB, and a drain connected to one of the output terminals of the associated latch unit, QB or Q, a second transistor TR2 having a gate connected to the other one of the D-terminals of the associated latch unit, DB or D, a source connected to a source of the first transistor TR1, and a drain connected to the other one of the output terminals of the associated latch unit, Q or QB, and a third transistor TR3 having a drain connected in common to both the sources of the first and second transistors TR1 and TR2, and a gate connected to one of the clock terminals of the associated latch unit, CK or CKB.

The latch LA includes a fourth transistor TR4 having a drain connected to one of the output terminals of the associated latch unit, Q or QB, a fifth transistor TR5 having a drain connected to the other one of the output terminals of the associated latch unit, QB or Q, while being connected to a gate of the fourth transistor TR4, and a source connected to the drain of the fourth transistor TR4, and a sixth transistor TR6 having a drain connected in common to both the sources of the fourth and fifth transistors TR4 and TR5, and a gate connected to the other one of the clock terminals of the associated latch unit, CKB or CK.

The current source IS1 is connected in common to both the source of the third transistor TR3 included in the inverter INT and the source of the sixth transistor TR6 included in the latch LA1, while being connected to a ground terminal.

In FIG. 8c, "±fin" represents the differential input signal, and "±fout-I" and "±fout-Q" are differential output signals, that is, the I and Q components of the quadrature signal, respectively.

"M1" to "M12" in FIG. 4 and "M21" to "M32" in FIG. 6 represent MOS transistors, respectively. "VDD" in FIGS. 4 and 6 represent a bias voltage.

Now, the operation and effect of the present invention will be described in detail with reference to FIGS. 3 to 8.

First, the quadrature signal generator with the feedback type frequency doubler according to the first embodiment of the present invention will be described with reference to FIGS. 3 and 4.

Referring to FIG. 3, the oscillator 510 of the quadrature signal generator according to the first embodiment of the present invention generates a predetermined differential oscillation frequency signal fin, and outputs the differential oscillation frequency signal fin to the feedback type frequency doubler 520.

The feedback type frequency doubler 520 generates a differential frequency signal fm corresponding to a frequency sum signal fin+fout obtained by summing the differential oscillation frequency signal fin received from the oscillator 510 and a quadrature signal fout received at the differential feedback terminal of the feedback type frequency doubler 520, and outputs the differential frequency signal fm at the differential output terminal. Where the differential oscillation frequency signal fin and quadrature signal fout are set to have the same frequency, the frequency sum signal fin+fout has a frequency of 2fin or 2fout.

The frequency divider 530 divides the differential frequency signal fm received from the feedback type frequency doubler 520 by 2, thereby generating the quadrature signal fout. The quadrature signal fout consists of two differential output frequency signals fout-I and fout-Q each having differential frequency components. The frequency divider 530 outputs the quadrature signal fout through its quadrature output terminal.

In association with the frequency divider 530 adapted to perform a frequency division by 2, the feedback type frequency doubler 520 is used which serves to generate a frequency higher than a desired usage frequency by two times. The quadrature signal fout is set to have the same frequency as the differential oscillation frequency fin. The frequency sum signal (fm=fin+fout) has a frequency (2 fin) being double the frequency of the differential oscillation frequency signal fin.

Referring to FIG. 4, the feedback type frequency doubler 520 includes the mixer 521, and the filter 522. The RF amplifying unit 521A of the mixer 521 amplifies the differential oscillation frequency signal fin received from the oscillator 510. The switching unit 521B of the mixer 521 switches on/off the differential oscillation frequency signal fin received through the RF amplifying unit 521A in accordance with a quadrature signal fout fed back thereto, thereby generating frequency sum and difference signals fin±fout. The load unit 521C of the mixer 521 I/V converts the signal generated from the switching unit 521B, and outputs the converted signal.

In accordance with the above described operation of the mixer 521, one of the two differential output frequency signals fout-I and fout-Q of the fed-back quadrature signal fout, fout-I or fout-Q, is mixed with the differential oscillation frequency signal fin by the switching unit 521B of the mixer 521, so that the frequency sum and difference signals fin±fout are generated. The frequency signal fm outputted from the mixer 522 has a frequency being double the frequency of the quadrature signal fout outputted from the frequency divider 530. This can be expressed by the following Expression 1:

$$fm = fin \pm fout = 2fout \qquad \text{[Expression 1]}$$

When Expression 1 is arranged with respect to the quadrature signal fout, the following Expression 2 can be derived:

$$fout = fin, \text{ and}$$

$$fout = \tfrac{1}{3} fin \qquad \text{[Expression 2]}$$

Thereafter, the filter 522 receives the frequency sum and difference signals fin±fout from the mixer 521, and selectively allows the frequency sum signal fin+fout to pass therethrough (fm=fin+fout). Since the input frequency of the quadrature signal generator of the present invention should be identical to the output frequency of the quadrature signal generator, that is, the differential oscillation frequency signal fin and quadrature signal fout should have the same frequency, the filter 522 is adapted to pass the frequency sum signal fin+fout outputted from the mixer 521 therethrough while preventing the frequency difference signal fin-fout outputted from the mixer 521 from passing therethrough. Accordingly, the feedback type frequency doubler can output a signal having a desired frequency being double the input frequency, that is, the frequency of the differential oscillation frequency signal fin. Thus, the quadrature signal generator with the feedback type frequency doubler according to the first embodiment of the present invention can output a quadrature signal having the same frequency as the input frequency.

Where the frequency of the differential oscillation frequency signal fin used in the present invention has a condition expressed by the following Expression 3, the filter 522 of the present invention has a frequency band expressed by the following Expression 4. Since the pass frequency $f_{filter}$ of the filter 522 corresponds to "fin+fout", and "fin+fout" is equal to "2fin" or "2fout" (fin+fout=2fin=2fout), the quadrature signal generator of the present invention satisfies the following Expression 5:

$$f_{min} < f_{in} < f_{max} \qquad \text{[Expression 3]}$$

$$2f_{min} < f_{filter} < 2f_{max} \qquad \text{[Expression 4]}$$

where, "$2f_{min}$" and "$2f_{max}$" may be set as respective cut-off frequencies of the HPF and LPF included in the filter 522.

$$fout = fin. \qquad \text{[Expression 5]}$$

Now, the quadrature signal generator with the feedback type frequency doubler according to the second embodiment of the present invention will be described with reference to FIGS. 5 and 6.

Referring to FIG. 5, the oscillator 610 of the quadrature signal generator according to the second embodiment of the present invention generates a predetermined differential oscillation frequency signal fin, and outputs the differential oscillation frequency signal fin to the feedback type frequency doubler 620, similarly to the oscillator 530 according to the first embodiment of the present invention.

The feedback type frequency doubler 620 generates a differential frequency signal fm corresponding to a frequency sum signal fin+fout obtained after summing the differential oscillation frequency signal fin received from the oscillator 610 with a signal obtained by synthesizing two differential output frequency signal components fout-I and fout-Q of a quadrature signal fout fed back to the feedback type frequency doubler 620, thereby generating a synthesized signal fout', and mixing the synthesized signal fout'. The feedback type frequency doubler 620 then outputs the differential frequency signal fm to the frequency divider 630.

The frequency divider 630 divides the differential frequency signal fm received from the feedback type frequency doubler 620 by 2, thereby generating the quadrature signal fout. The quadrature signal fout consists of two differential output frequency signals fout-I and fout-Q each having differential frequency components. The frequency divider 630 outputs the quadrature signal fout through its quadrature output terminal.

In association with the frequency divider 630 adapted to perform a frequency division by 2, the feedback type frequency doubler 620 is used which serves to generate a frequency higher than a desired usage frequency by two times. The quadrature signal fout is set to have the same frequency as the differential oscillation frequency fin. The frequency sum signal (fm=fin+fout) has a frequency (2 fin) being double the frequency of the differential oscillation frequency signal fin.

Referring to FIG. 6, the feedback type frequency doubler 620 includes the mixer 621, and the filter 622. The RF amplifying unit 621A of the mixer 621 amplifies the differential oscillation frequency signal fin received from the oscillator 610. The switching unit 621B of the mixer 621 switches on/off the differential oscillation frequency signal fin received through the RF amplifying unit 621A in accordance with a synthesized signal fout' having a synthesized phase of the differential output frequencies fout-I and fout-Q fed back to the switching unit 621B, thereby generating frequency sum and difference signals fin±fout'. The load unit 621C of the mixer 621 I/V converts the signal generated from the switching unit 621B, and outputs the converted signal.

The first switching unit 621B-1 of the switching unit 621B switches on/off the differential oscillation frequency signal fin from the oscillator 610 in accordance with one of the differential output frequency signals fed back from the frequency divider 630, fout-I or fout-Q. On the other hand, the second switching unit 621B-2 of the switching unit 621B switches on/off the differential oscillation frequency signal fin from the oscillator 610 in accordance with the other one of the differential output frequency signals fed back from the frequency divider 630, fout-Q or fout-I.

In accordance with the above described operation of the mixer 621, the switching unit 621B synthesizes the two differential output frequency signals fout-I and fout-Q fed back thereto to generate the synthesized signal fout', and then mixes the synthesized signal fout' with the differential oscillation frequency signal fin received from the oscillator 510, so that the frequency sum and difference signals fin±fout' are generated. The frequency signal fm outputted from the mixer 622 has a frequency being double the frequency of the quadrature signal fout outputted from the frequency divider 630. This can be expressed by the following Expression 6:

$$fm = fin \pm fout' = 2fout \qquad \text{[Expression 6]}$$

When Expression 6 is arranged with respect to the quadrature signal fout, the following Expression 2 can be derived because the quadrature signal fout is substantially identical to the synthesized signal fout'.

$$fout = fin, \text{ and}$$

$$fout = \tfrac{1}{2} fin \qquad \text{[Expression 7]}$$

Subsequent operations of the second embodiment of the present invention are the same as those of the first embodiment of the present invention. Therefore, the quadrature signal generator with the feedback type frequency doubler according to the second embodiment of the present invention can output a quadrature signal having the same frequency as the input frequency.

Hereinafter, practical examples of the filter circuit and frequency divider circuit applied in common to the embodiments of the present invention will be described with reference to FIGS. 7 and 8, respectively.

Referring to FIG. 7, the low pass filter LPF included in the filter applied to the present invention transmits frequency components of a frequency band lower than a cut-off frequency set to be higher than the frequency of the frequency sum signal (fm=fin+fout) outputted from the mixer 621. On the other hand, the high pass filter HPF included in the filter transmits frequency components of a frequency band higher than a cut-off frequency set to be lower than the frequency of the frequency sum signal (fm=fin+fout) outputted from the mixer 621. In accordance with such operations of the low and high pass filters LPF and HPF, only the frequency sum component (fm=fin+fout) of the frequency sum and difference signals (fm=fin±fout) from the mixer 621 can pass through the filter. Here, "$2f_{min}$" and "$2f_{max}$" may be set as respective cut-off frequencies of the high and low pass filters HPF and LPF in the filter 522.

The first and second latch units LA1 and LA2 included in the frequency divider shown in FIG. 8a operate alternately in accordance with differential input signals respectively inputted thereto. In a period T1 in the timing diagram of FIG. 8c, both the first and second latch units LA1 and LA2 are maintained in predetermined initial states thereof, respectively. In a period T2, the inverter INT of the first latch unit LA1 is activated in accordance with differential input signals ±fin inputted to respective clock terminals CK and CKB of the first latch unit LA1, and a signal inputted to the D-terminal D of the first latch unit LA1. At this time, the latch LA of the first latch unit LA1 is deactivated. On the contrary, the inverter INT of the second latch unit LA2 is deactivated in accordance with the differential input signals ±fin inputted to respective clock terminals CK and CKB of the second latch unit LA2, and a signal inputted to the D-terminal D of the second latch unit LA2. At this time, the latch LA of the second latch unit LA2 is activated. At this time, the inverter INT of the first latch unit LA1 inverts the input signal applied thereto, so that it outputs the inverted input signal.

Subsequently, in a period T3, the inverter INT of the first latch unit LA1 is deactivated in accordance with the differential input signals ±fin inputted to respective clock terminals CK and CKB of the first latch unit LA1, and the signal inputted to the D-terminal D of the first latch unit LA1. At this time, the latch LA of the first latch unit LA1 is activated. On the contrary, the inverter INT of the second latch unit LA2 is activated in accordance with the differential input signals ±fin inputted to respective clock terminals CK and CKB of the second latch unit LA2, and the signal inputted to the D-terminal D of the second latch unit LA2. At this time, the latch LA of the second latch unit LA2 is deactivated. At this time, the inverter INT of the second latch unit LA1 receives the inverted input signal, and inverts the received signal, thereby outputting the component +fout-Q of a differential output signal ±fout-Q included in differential output signals ±fout-I and ±fout-Q.

In periods T4 and T5, the same operations as those in the periods T2 and T3 are carried out to output the component–fout-I of the differential output signal ±fout-I and the component –fout-Q of the differential output signal ±fout-Q. As these operations are repeated, a quadrature signal consisting of the differential output signals ±fout-I and ±fout-Q is outputted. The two differential output signals fout-I and fout-Q of the quadrature signal have a phase difference of 90°, as shown in FIG. 8c.

The above described quadrature signal generator according to each embodiment of the present invention can generate a quadrature signal having more reliable differential characteristics by adding a mixer and a filter thereto while using a feedback loop.

As apparent from the above description, the present invention provides a quadrature signal generator, which is applied to a ZERO-IF converter or image rejection converter of a broadcast receiver, and adapted to generate I and Q signals, can generate a quadrature signal having the same frequency as a differential oscillating frequency, using a feedback control system.

Accordingly, it is possible to secure more reliable symmetric characteristics.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A quadrature signal generator comprising:
   an oscillator for generating a differential oscillation frequency signal having predetermined differential oscillation frequencies;
   a feedback type frequency doubler having a differential input terminal connected to an output terminal of the oscillator while having a differential feedback terminal and a differential output terminal, the feedback type frequency doubler generating a differential frequency signal having differential frequency components corresponding to differential frequency components of a frequency sum signal obtained by summing the differential oscillation frequency signal received from the oscillator and a differential feedback signal received at the differential feedback terminal, and outputting the differential frequency signal at the differential output terminal; and a frequency divider having a differential input terminal connected to the differential output terminal of the feedback type frequency doubler, and a quadrature output terminal including two differential output terminals, the frequency divider dividing the differential frequency signal received at the differential input terminal thereof by 2, thereby generating a quadrature signal consisting of two differential output frequency signals each having differential frequency components, and outputting the quadrature signal through the quadrature output terminal thereof to supply at least one differential output frequency signal of the quadrature signal to the feedback type frequency doubler as the differential feedback signal.

2. The quadrature signal generator according to claim 1, wherein the differential feedback terminal of the feedback type frequency doubler is connected to one differential output terminal of the quadrature output terminal in the frequency divider.

3. The quadrature signal generator according to claim 2, wherein the feedback type frequency doubler comprises:

a mixer for mixing the differential output frequency signal fed back from the frequency divider with the differential oscillation frequency signal received from the oscillator, thereby generating frequency sum and difference signals; and a filter for receiving the frequency sum and difference signals, and selectively allowing the frequency sum signal to pass therethrough.

4. The quadrature signal generator according to claim 3, wherein the quadrature signal outputted from the frequency divider is set to have the same frequency as the differential oscillation frequency signal from the oscillator.

5. The quadrature signal generator according to claim 3, wherein the frequency sum signal outputted from the mixer is set to have a frequency double the frequency of the differential oscillation frequency signal from the oscillator.

6. The quadrature signal generator according to claim 1, wherein the differential feedback terminal of the feedback type frequency doubler includes:

a first differential feedback terminal connected to one differential output terminal of the quadrature output terminal in the frequency divider; and a second differential feedback terminal connected to the other differential output terminal of the quadrature output terminal in the frequency divider.

7. The quadrature signal generator according to claim 6, wherein the feedback type frequency doubler comprises:

a mixer for synthesizing the differential output frequency signals fed back from the frequency divider to generate a synthesized signal, and mixing the synthesized signal with the differential oscillation frequency signal received from the oscillator, thereby generating frequency sum and difference signals; and a filter for receiving the frequency sum and difference signals, and selectively allowing the frequency sum signal to pass therethrough.

8. The quadrature signal generator according to claim 7, wherein the quadrature signal outputted from the frequency divider is set to have the same frequency as the differential oscillation frequency signal from the oscillator.

9. The quadrature signal generator according to claim 7, wherein the frequency sum signal outputted from the mixer is set to have a frequency double the frequency of the differential oscillation frequency signal from the oscillator.

10. The quadrature signal generator according to claim 7, wherein the mixer comprises:

a first switching unit for switching on/off the differential oscillation frequency signal from the oscillator in accordance with one of the differential output frequency signals fed back to the mixer; and a second switching unit for switching on/off the differential oscillation frequency signal from the oscillator in accordance with the other one of the differential output frequency signals fed back to the mixer.

* * * * *